(12) United States Patent
Li et al.

(10) Patent No.: US 9,899,431 B2
(45) Date of Patent: Feb. 20, 2018

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Guang Li, Beijing (CN); Libin Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/513,743

(22) PCT Filed: Mar. 14, 2016

(86) PCT No.: PCT/CN2016/076261
§ 371 (c)(1),
(2) Date: Mar. 23, 2017

(87) PCT Pub. No.: WO2016/165512
PCT Pub. Date: Oct. 20, 2016

(65) Prior Publication Data
US 2017/0287952 A1   Oct. 5, 2017

(30) Foreign Application Priority Data
Apr. 13, 2015   (CN) .......................... 2015 1 0172719

(51) Int. Cl.
*G02F 1/1343* (2006.01)
*H01L 27/12* (2006.01)
(Continued)

(52) U.S. Cl.
CPC ........ *H01L 27/1255* (2013.01); *H01L 27/124* (2013.01); *G02F 1/1368* (2013.01);
(Continued)

(58) Field of Classification Search
CPC ............ H01L 27/1255; H01L 127/124; G09G 3/3266; G09G 3/3677; G09G 2300/0426;
(Continued)

(56) References Cited

U.S. PATENT DOCUMENTS 6,602,790 B2 * 8/2003 Kian ................. G02F 1/133305
438/30
7,663,240 B2 * 2/2010 Hiroi ..................... H01L 23/564
257/758

(Continued)

FOREIGN PATENT DOCUMENTS

CN   1912717 A   2/2007
CN   1926656 A   3/2007
(Continued)

OTHER PUBLICATIONS

Search Report and Written Opinion dated Jun. 15, 2016 from State Intellectual Property Office of the P.R. China.

*Primary Examiner* — Jarrett Stark
(74) *Attorney, Agent, or Firm* — Dilworth & Barrese, LLP.; Michael J. Musella, Esq.

(57) ABSTRACT

An array substrate, a display panel and a display device are provided. The array substrate comprises: an active area, a package area and a drive circuit area, wherein the drive circuit area is located between the active area and the package area. A package metal layer is provided at the package area, and at least one groove structure is provided on a side of the package metal layer in a proximity to the drive circuit area. At least one drive unit is provided at the drive circuit area and comprises at least one element, wherein the element is provided in the groove structure.

19 Claims, 2 Drawing Sheets

(51) Int. Cl.
*G09G 3/36* (2006.01)
*G09G 3/3266* (2016.01)
*G09G 3/3225* (2016.01)
*G02F 1/1345* (2006.01)
*G02F 1/1333* (2006.01)
*G02F 1/1368* (2006.01)
*G02F 1/1362* (2006.01)

(52) U.S. Cl.
CPC .... *G02F 1/13454* (2013.01); *G02F 1/133345* (2013.01); *G02F 1/134309* (2013.01); *G02F 1/136286* (2013.01); *G09G 3/3225* (2013.01); *G09G 3/3266* (2013.01); *G09G 3/3677* (2013.01); *G09G 2300/0408* (2013.01); *G09G 2300/0426* (2013.01)

(58) Field of Classification Search
CPC .......... G09G 2300/0408; G09G 3/3225; G02F 1/133345; G02F 1/13454; G02F 1/136286; G02F 1/1368; G02F 1/134309
See application file for complete search history.

(56) References Cited

U.S. PATENT DOCUMENTS

| | | | |
|---|---|---|---|
| 8,530,997 B1* | 9/2013 | Yang | H01L 23/5225 257/503 |
| 9,111,063 B2* | 8/2015 | Saito | G06F 17/5068 |
| 2002/0153243 A1* | 10/2002 | Forrest | C23C 14/32 204/192.12 |
| 2003/0038913 A1* | 2/2003 | Choo | G02F 1/1339 349/149 |
| 2004/0150070 A1* | 8/2004 | Okada | H01L 22/32 257/508 |
| 2006/0055007 A1* | 3/2006 | Yao | B28D 5/0011 257/660 |
| 2007/0126357 A1 | 6/2007 | Lee et al. | |
| 2007/0241085 A1* | 10/2007 | Hiroya | B23K 26/40 219/121.72 |
| 2008/0251923 A1* | 10/2008 | Wang | H01L 23/585 257/758 |
| 2009/0294929 A1* | 12/2009 | Lee | H01L 23/5225 257/659 |
| 2010/0084751 A1* | 4/2010 | Frederick, Jr. | H01L 23/562 257/678 |
| 2013/0249877 A1* | 9/2013 | Choi | G09G 3/20 345/205 |
| 2015/0070616 A1* | 3/2015 | Ogasawara | G02F 1/1339 349/43 |
| 2016/0113106 A1* | 4/2016 | Kim | H05K 1/028 361/749 |
| 2016/0315284 A1* | 10/2016 | Jeon | H01L 51/5246 |
| 2017/0249916 A1* | 8/2017 | Jen | G09G 3/3677 |

FOREIGN PATENT DOCUMENTS

| | | |
|---|---|---|
| CN | 103135288 A | 6/2013 |
| CN | 103681771 A | 3/2014 |
| CN | 104749806 A | 7/2015 |

* cited by examiner

ARRAY SUBSTRATE, DISPLAY PANEL AND DISPLAY DEVICE

TECHNICAL FIELD

Embodiments of the present disclosure relate to an array substrate, a display panel and a display device.

BACKGROUND

A narrow-frame display product refers to that a ratio of an active area (AA) to a peripheral area is relative large, and a user can acquire a better experience when watching image display. In addition, when a narrow-frame display product, such as a display panel, is applied to a splicing screen, because a frame of a single display panel is very narrow, a width of a spliced seam at a spliced position can be reduced, and an overall display effect of the splicing screen can be remarkably improved. Thus, a demand for the narrow-frame display product in a current market becomes more and more urgent.

SUMMARY

Embodiments of the present disclosure relate to an array substrate, a display panel and a display device, in which a frame width of the display panel can be reduced without affecting a function of the package, thus better meeting a requirement for a display product to have a narrow frame.

On one aspect, an embodiment of the present disclosure provides an array substrate, comprising: an active area, a package area and a driving circuit area, the driving circuit area being located between the active area and the package area; a packaging metal layer, arranged in the package area, and a side of the packaging metal layer facing to the driving circuit area being provided with at least one groove structure; at least one driving unit, arranged in the driving circuit region and comprising at least one element; wherein, the element is arranged in the groove structure.

On another aspect, an embodiment of the present disclosure provides a display panel, comprising the above described array substrate.

On yet another aspect, an embodiment of the present disclosure provides a display device, comprising the above described display panel.

BRIEF DESCRIPTION OF THE DRAWINGS

In order to clearly illustrate technical solutions of the embodiments of the disclosure or in the prior art, drawings needing to be used in the embodiments or in the prior art will be introduced simply, and it is obvious that the described drawings are just some of the embodiments of the present disclosure, and those skilled in the art can also obtain other drawings according to the drawings, without any inventive work.

DETAILED DESCRIPTION

The technical solutions of the embodiments of the present disclosure will be described in a clearly and fully understandable way in connection with the drawings in the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

What needs to be pointed out is that, unless otherwise defined, all terms (comprising technical and scientific terms) used in the embodiments of the present disclosure have same meaning jointly understood by those skilled in the field to which the present disclosure belongs. What should also be understood is that, those terms commonly defined in a dictionary should be understood to have meanings consistent with meanings in the context in the related art, and cannot be explained in idealized or extremely-formalized sense, unless explicitly defined herein.

Figure 1:
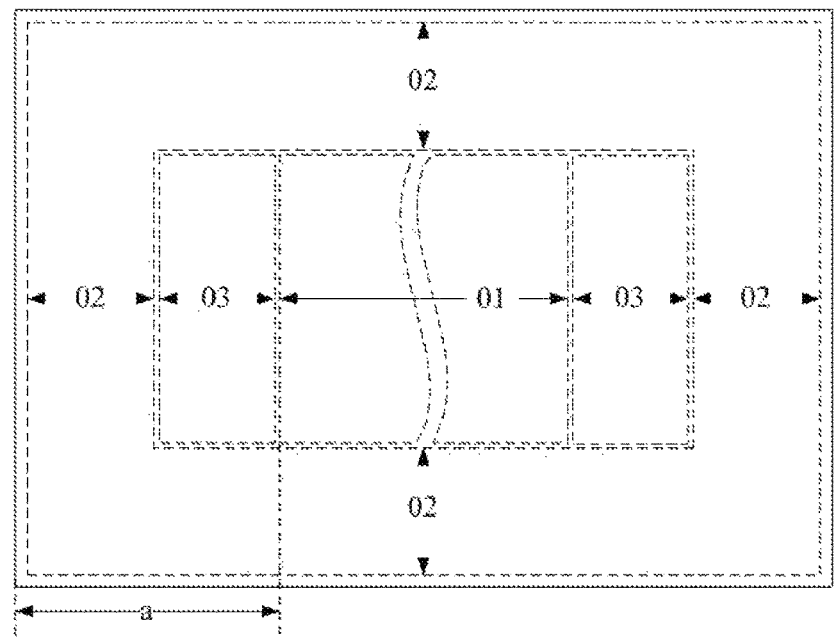
FIG. 1 is a top-view structural schematic diagram of various areas of an array substrate.

FIG. 1 shows a plan view of a narrow-frame display product. As shown in FIG. 1, a driving circuit such as a gate driving circuit is a Gate Driver on Array (GOA) circuit, is directly manufactured on an array substrate, thus omitting circuit structure parts arranged on the array substrate, such as a gate drive Integrated Circuit (IC) large in area, a Chip On Film (COF) for fixing the gate drive IC, and corresponding leads and so on. Thus, the array substrate with the GOA circuit can partly reduce the peripheral area of a cell-assembled display panel. However, because the GOA circuit has been very simplified, it is quite difficult to further simplify the GOA circuit. Therefore, the region of a peripheral area occupied by a driving circuit area 03 is not easy to be further reduced.

Secondly, referring to FIG. 1, as for a display panel of a certain size, a needed area of a package area 02 located around an active area 01 is also certain; if the area of the package area 02 is too small, serious defects of the display panel that packaging is not good and box thicknesses are not consistent will be caused, and normal display of the display panel is affected. Thus, the area of the package area 02 is not easy to be further reduced.

Figure 2:
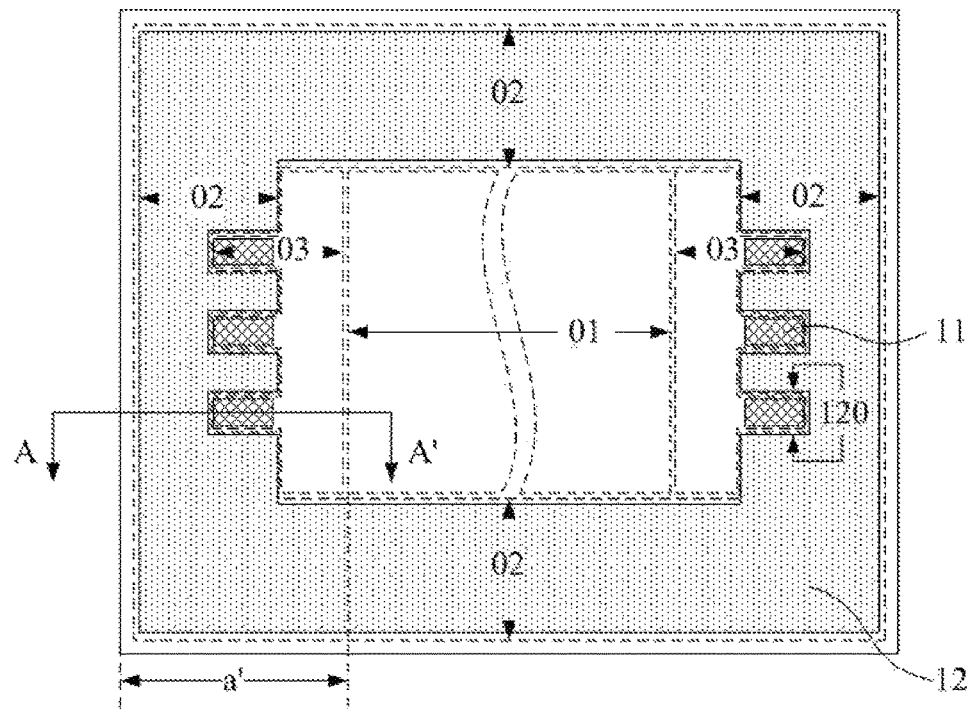
FIG. 2 is a top-view structural schematic diagram of an array substrate provided by an embodiment of the present disclosure.

An embodiment of the present disclosure provides an array substrate; as shown in FIG. 2, the array substrate has an active area 01, a package area 02 and a driving circuit area 03, and the driving circuit area 03 is located between the active area 01 and the package area 02; the array substrate can specifically include: a packaging metal layer 12 arranged in the package area 02, and a side of the packaging metal layer 12 facing to the driving circuit area 03 is provided with at least one groove structure 120; and at least one driving unit, arranged in the driving circuit area 03, the driving unit can include a capacitive structure 11; wherein, the capacitive structure 11 is arranged in the groove structure 120, and one groove structure 120 is configured for accommodating one capacitive structure 11. Or, one groove structure 120 can accommodates one or more capacitive structure 11.

Exemplarily, the embodiment of the present disclosure takes that the capacitive structures of the driving unit is arranged in the groove structures as an example, but it can also be that other structures of the driving unit are arranged in the groove structure, which is not limited in the embodiment of the present disclosure.

Firstly, in order to conveniently understand the embodiment of the present disclosure, some concepts involved in the embodiment of the present disclosure are explained as follows.

1. The packaging metal layer 12

An exemplary structure of a Liquid Crystal Display (LCD) product or an Organic Light-Emitting Display (OLED) product is formed by cell assembling an array substrate and an counter substrate (a color filter substrate or a package substrate), and a sealant (which is usually frit glass adhesive) needs to be coated in the package area to cell assemble the array substrate and the counter substrate; in order to make curing of the sealant uniform during heating and improve sealability of packaging, the packaging metal layer formed by one or more metal layers can be firstly formed in the package area of the array substrate, and then the packaging metal layer is coated with sealant.

In the embodiment of the present disclosure, the packaging metal layer 12 can be a metal element and/or an alloy, and an existing technical material known by the inventors of the present disclosure can be adopted for a specific material of the packaging metal layer 12, which is not defined.

2. The driving circuit area 03

The above driving circuit area 03 is provided with a circuit driving for the array substrate, and the driving circuit can include but is not limited to a gate driving circuit (GOA) and a source driving circuit.

3. The capacitive structure 11

Taking the gate driving circuit as an example, a common gate driving circuit exemplarily includes a plurality of connected gate driving units, and each gate driving unit includes a gate driving capacitive structure for storing electrical charges; according to design of specific circuits of the array substrate, there is a slight difference between structures of the gate driving circuit, which is not described one by one herein; but a principle of the gate driving circuit is to play a role of a shifting register in the array substrate, and therefore all gate driving circuits have such capacitive structure.

The embodiment of the present disclosure does not define the rest of circuit structures except the capacitive structure 11 in the above driving unit, which takes the gate driving unit as an example, and circuit structures known by the inventors of the disclosure can be adopted.

Herein, because capacitors can be divided into a variety of types such as a cylindrical capacitor, a spherical capacitor, a plate capacitor and the like, wherein, the plate capacitor is composed of two electrode plates spaced apart by a certain distance and isolated by a space or a dielectric in between. The above capacitive structure 11 involved in the specific embodiment of the present disclosure exemplarily is a plate capacitor and can also be any other capacitor.

In order to achieve the role of the above shifting register by the whole gate driving circuit, the capacitive structure 11 needs to have a certain electricity storing capacity (represented as C); and, when the gate driving circuit is applied to driving a display panel with a relative large size, in order to respond to a requirement of a large-sized display panel for a row driving circuit, the capacitance C of the above capacitive structure 11 will be increased accordingly.

Capacitance C of the plate capacitor has a following expression:

$$C = \varepsilon \cdot \frac{A}{d}$$

Where, $\varepsilon$ is a permittivity of the dielectric, A is a direct facing area of the electrode plates, and d is a distance between the electrode plates.

It can be seen from the above expression that, the capacitance C is associated with the permittivity $\varepsilon$ of the dielectric, the direct facing area A of the electrode plates and the distance d between the electrode plates.

For the capacitive structure 11 in the gate driving unit with a certain design specification requirement, because a dielectric material applied to a display panel is commonly silicon nitride, silicon oxide and other materials, a numerical value of the permittivity $\varepsilon$ is relatively fixed; and the distance d between the electrode plates is not easy to be further reduced; and thus, for the display panel, it can be considered that the capacitance C of the above capacitive structure 11 is in direct proportion to the direct facing area A of the electrode plates.

Thus, in order to meet a requirement of a circuit design requirement for the capacitance C of the capacitive structure 11 it is required that the direct facing area A of the electrode plates in the capacitive structure 11 is relatively large, as a result, the region occupied by the capacitive structure 11 is relatively large.

Figure 3:
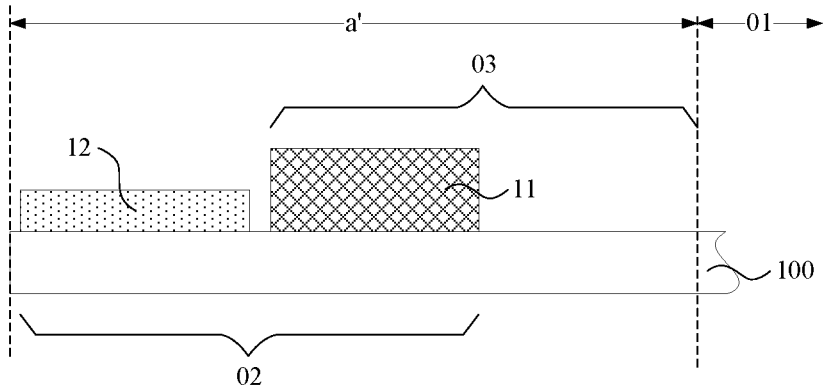
FIG. 3 is an A-A' sectional amplified schematic diagram I in FIG. 2.

Based on this, in the array substrate provided by the embodiment of the present disclosure, because the side of the packaging metal layer 120 facing to the driving circuit area 03 is provided with at least one groove structure 120, and one groove structure 120 is configured for accommodating one or more capacitive structures 11; that is, the groove structures 120 correspond to the capacitive structures 11 in one to one correspondence in terms of positional relationship. Thus, in the above structure, the region occupied by the capacitive structure 11 with a relative large area is interposed in the package area 02, namely in a transverse direction in FIG. 3, and the package area 02 and the driving circuit area 03 get close to each other in a concave-convex intersecting manner. Referring to FIG. 3, compared with a frame width a of FIG. 1, in a case that a size of the active area 01 is not changed and the direct-facing area of the capacitive structure in the driving circuit is not changed, a frame width a' of the above array substrate provided by the embodiment of the present disclosure is obviously less than a frame width a of FIG. 1 because a width of a region occupied by the capacitive structure 11 is obviously decreased.

In addition, because the groove structure 120 is only provided on the side of the packaging metal layer 12 facing to the driving circuit area 03, which hardly influences an overall area needed for the packaging metal layer 120 to achieve a corresponding packaging effect. Therefore, the frame width can be obviously decreased on a premise that a packaging effect is not affected.

In this way, as for display panels with the same size, because the above array substrate provided by the embodiment of the present disclosure can have the smaller frame width a', the active area 01 can be formed to be larger, and therefore a ratio of the active area 01 to the peripheral area can be larger, and a user can have a better experience when watching image display; and, when the display panel adopting the above array substrate is applied to a splicing screen, a splicing seam of every sub-screen is smaller, and a display effect is better.

Figure 4:
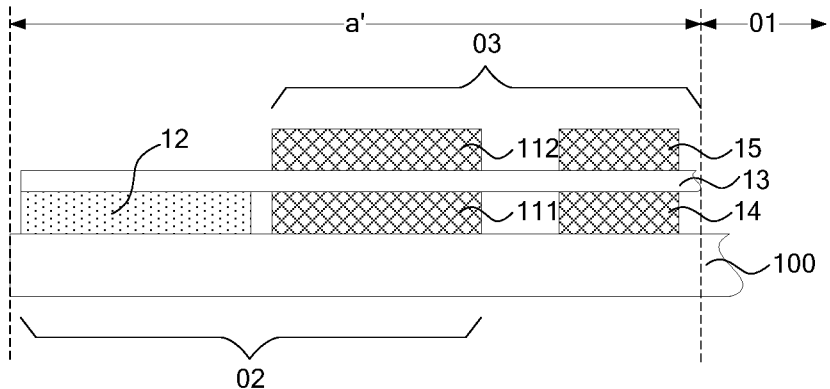
FIG. 4 is an A-A' sectional amplified schematic diagram II in FIG. 2.
Figure 5:
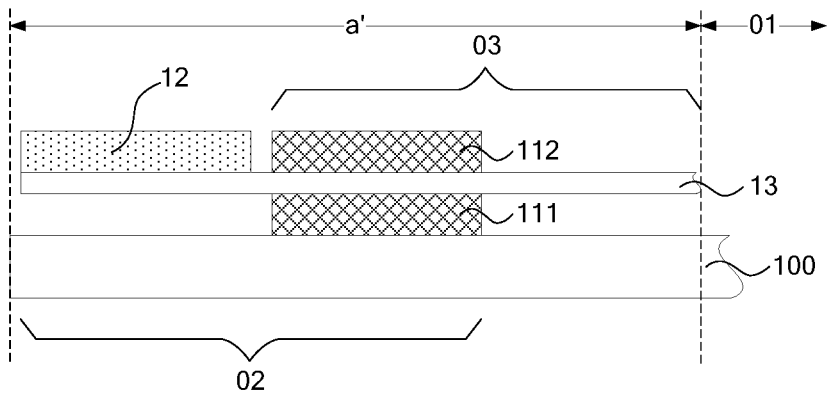
FIG. 5 is an A-A' sectional amplified schematic diagram III in FIG. 2.

Furthermore, as shown in FIG. 4 and FIG. 5, the array substrate can further includes an insulating layer 13; in a direction perpendicular to a plate surface of the array substrate (namely in the sectional views shown in FIG. 4 and FIG. 5), the capacitive structure 11 includes a first electrode 111 and a second electrode 112 which are oppositely arranged and insulated; the insulating layer 13 is at least located between the first electrode 111 and the second electrode 112; the packaging metal layer 12 can be arranged on a same layer as the first electrode 111 or the second electrode 112.

It is understood that, firstly, the insulating layer 13 plays a role of spacing the first electrode 111 apart from the second electrode 112 to form the above capacitive structure 11. Thus, the insulating layer 13 should be at least located between the above two electrodes. Of course, considering simplifying an overall preparation process of the array substrate, the insulating layer 13 can also, with reference to FIG. 4 and FIG. 5, be arranged in the package area 02, which is not specifically defined.

Secondly, the so called "arranged on a same layer" is for at least two patterns and refers to that at least two patterns are arranged in a same-layer structure. Exemplarily, there may be at least two patterns made from a same material by a same patterning process and located on a same layer.

For example, referring to FIG. 4, the packaging metal layer 12 together with the first electrode 111 of the capacitive structure 11 are arranged on the base substrate 100; or, referring to FIG. 5, the packaging metal layer 12 together with the second electrode 112 of the capacitive structure 11 are arranged on the insulating layer 13. In this way, one electrode plate in the capacitive structure 11 can be prepared when the packaging metal layer 12 is prepared, and therefore a utilization rate of a patterning process of the array substrate is increased, and a preparation process is simplified.

Exemplarily, referring to FIG. 4, the driving unit further includes at least one thin film transistor; the first electrode 111 can be arranged on the same layer as a gate metal layer 14 of the thin film transistor; and the second electrode 112 can be arranged on the same layer as a source and drain metal 15 of the thin film transistor.

It is understood that, the gate metal layer 14 is a pattern layer including a gate electrode of the thin film transistor; and the source and drain metal layer 15 is a pattern layer including a source electrode and a drain electrode of the thin film transistor.

The number of TFTs in the driving unit is not limited and can be adjusted according to circuit design of the driving circuit. When there is a plurality of TFTs in the driving unit, the above gate metal layer 14 can be a pattern layer including gate electrodes of all the TFTs, and the source and drain metal layer 15 can be a pattern layer including source electrodes and drain electrodes of all the TFTs.

In this way, when the packaging metal layer 12 is arranged on the same layer as the first electrode 111, because the first electrode 111 is further arranged on the same layer as the gate metal layer 14, the above packaging metal layer 12, the first electrode 111 and the gate metal layer 14 can be prepared by a same patterning process, or, the above packaging metal layer 12, the second electrode 112 and the source and drain metal layer 15 can be prepared by a same patterning process, and therefore a technological process is further simplified, and cost is reduced.

Although not shown in the embodiment of the present disclosure, it is understood by those skilled in the art that the active area 01 includes a plurality of pixel units arranged in a matrix, and each pixel unit includes a TFT; the first electrode 111 is arranged on the same layer as the gate metal layer 14 in the TFT of the driving unit, and can also be arranged on a same layer as a gate metal layer of the TFT of the active area 01; of course, the second electrode 112 is arranged on the same layer as the source and drain metal layer 15 in the TFT of the driving unit, and can also be arranged on a same layer as a source and drain metal layer of the TFT of the active area 01, so as to further increase the utilization rate of the patterning process and simplify the preparation process.

In this case, the insulating 13 can also extend to the active area 01 and can be a gate insulating layer covering the gate metal layers of the TFTs of the respective areas.

Herein, FIG. 4 is only shown by taking an example that, relative to the base substrate 100, the first electrode 111 is located below and the second electrode 112 is located above; relative positions of the first electrode 111 and the second electrode 112 can be equivalently exchanged, which is not specifically limited.

On the above basis, considering that currently a driving circuit which is directly manufactured on the array substrate is mainly the gate driving circuit, which can replace a traditional gate drive IC to directly perform row scanning driving on gate lines, in the embodiment of the present disclosure, exemplarily, the above driving circuit area 03 includes a gate driving circuit area, and the diving unit includes a gate driving unit located in the gate driving circuit area.

Further, referring to FIG. 2, when the driving circuit area 03 includes the gate driving circuit area, the gate driving circuit area can be arranged on one or two sides of the active area 01 in the gate line direction, and therefore there is no need for extra leads and other circuit structures used for connecting the gate driving circuit and the gate line, thus avoiding enlarge the peripheral area on an outer side of the active area.

Further, the array substrate further includes: a sealant located on the packaging metal layer 12.

Herein, the capacitive structures 11 are interposed at the positions of the groove structures 120 of the packaging metal layer 12. Therefore, when laser is utilized to irradiate and melt the glass sealant, in order to avoid influences of laser irradiation on device performance of the capacitive structure 11, the laser can be only irradiated to the portion of the packaging metal layer 12 by adjusting an irradiating path of laser beams, so as to avoid possible influences of laser irradiation on the capacitive structure 11.

On the above basis, an embodiment of the present disclosure further provides a display panel, comprising the above array substrate.

Further, the embodiment of the present disclosure further provides a display device, comprising the above display panel.

Herein, the above display device specifically can be a liquid crystal display device, such as a liquid crystal TV set, an OLED TV set or electronic paper, a digital photo frame, a mobile phone, a tablet personal computer, a displayer, a notebook computer, a navigator and any product or part with a display function.

In the above array substrate provided by the embodiment of the present disclosure, because the side of the packaging metal layer facing to the driving circuit area is provided with at least one groove structure, and one groove structure is configured for accommodating one element, such as the capacitive structure, that is to say, the groove structures correspond to the capacitive structures in one to one correspondence in terms of the positional relationship. Thus, in the above structure, the relative large region occupied by the capacitive structure is interposed into the package area; that is, the package area and the driving circuit area get close to each other in the concave-convex interposing manner. Compared with a frame width a in the prior art, when the size of the active area is not changed and the direct-facing area of the capacitive structure in the driving circuit is not changed, the frame width a' of the above array substrate provided by the embodiment of the present disclosure is obviously less than the frame width a in the prior art because the width of the region occupied by the capacitive structure is obviously decreased.

Besides, because the groove structure is only provided on the side of the packaging metal layer facing to the driving circuit area, the influences on the overall area needed for the packaging metal layer to achieve the corresponding packaging effect are very small, and therefore the frame width in the prior art can be obviously reduced on the premise that the packaging effect is not affected.

In this way, as for display panels with the same size, because the above array substrate provided by the embodiment of the present disclosure can have a smaller frame width a', the active area can be formed to be larger. Therefore, the ratio of the active area to the peripheral area can be larger, and the user can acquire a better experience when watching image display; and, when the display panel adopting the above array substrate is applied to a splicing screen, the splicing seam of every sub-screen is smaller, and the display effect is better.

It is understood that, all the drawings of the present disclosure are simple schematic diagrams of the array substrate, and only aim at clearly describing structures relevant to inventive points of the present solution; and other structures irrelevant of the inventive points are not embodied or are only partially embodied in the drawings.

What are described above are only specific embodiments of the present invention, and the protection scope of the present invention is not limited thereto. It shall easily occur to one person skilled in the art within the technical scope of the disclosure of the present invention that various changes or replacements shall be covered within the scope of the present invention. Therefore, the scope of the present invention should be the scope of the following claims.

The present application claims priority of Chinese Patent Application No. 201510172719.8 filed on Apr. 13, 2015, the present disclosure of which is incorporated herein by reference in its entirety as part of the present application.

The invention claimed is:

1. An array substrate, comprising:
an active area, a package area and a driving circuit area, the driving circuit area being located between the active area and the package area;
a packaging metal layer, arranged in the package area, and a side of the packaging metal layer facing to the driving circuit area being provided with at least one groove structure;
at least one driving unit, arranged in the driving circuit region and comprising at least one element; wherein, the element is arranged in the groove structure.

2. The array substrate according to claim 1, wherein, the element is of a capacitive structure.

3. The array substrate according to claim 2, wherein, one groove structure accommodates one capacitive structure.

4. The array substrate according to claim 2, wherein, the array substrate further comprises an insulating layer;
in a direction perpendicular to a plate surface of the array substrate, the capacitive structure includes: a first electrode and a second electrode which are oppositely arranged and insulated; the insulating layer is at least located between the first electrode and the second electrode;
the packaging metal layer is arranged on a same layer as the first electrode or the second electrode.

5. The array substrate according to claim 2, wherein, the driving unit further includes: at least one thin film transistor; the first electrode is arranged on a same layer as a gate metal layer or a source and drain metal layer of the thin film transistor; the second electrode is arranged on a same layer as the source and drain metal layer or the gate metal layer of the thin film transistor.

6. The array substrate according to claim 1, wherein, the driving circuit area includes a gate driving circuit area; and the driving unit includes a gate driving unit located in the gate driving circuit area.

7. The array substrate according to claim 6, wherein, the gate driving circuit area is located on one or two sides of the active area in a gate line direction.

8. The array substrate according to claim 1, wherein, the array substrate further comprises: sealant located on the packaging metal layer.

9. The array substrate according to claim 1, wherein, the active area further includes a plurality of pixel units, each pixel unit includes a thin film transistor, and the first electrode is arranged on a same layer as a gate metal layer or a source and drain metal layer of the thin film transistor; the second electrode is arranged on a same layer as the source and drain metal layer or the gate metal layer of the thin film transistor.

10. A display panel, comprising the array substrate according to claim 1.

11. A display device, comprising the display panel according to claim 10.

12. The array substrate according to claim 3, wherein, the array substrate further comprises an insulating layer;
in a direction perpendicular to a plate surface of the array substrate, the capacitive structure includes: a first electrode and a second electrode which are oppositely arranged and insulated; the insulating layer is at least located between the first electrode and the second electrode;
the packaging metal layer is arranged on a same layer as the first electrode or the second electrode.

13. The array substrate according to claim 3, wherein, the driving unit further includes: at least one thin film transistor; the first electrode is arranged on a same layer as a gate metal layer or a source and drain metal layer of the thin film transistor; the second electrode is arranged on a same layer as the source and drain metal layer or the gate metal layer of the thin film transistor.

14. The array substrate according to claim 2, wherein, the driving circuit area includes a gate driving circuit area; and the driving unit includes a gate driving unit located in the gate driving circuit area.

15. The array substrate according to claim 3, wherein, the driving circuit area includes a gate driving circuit area; and the driving unit includes a gate driving unit located in the gate driving circuit area.

16. The array substrate according to claim 2, wherein, the array substrate further comprises: sealant located on the packaging metal layer.

17. The array substrate according to claim 3, wherein, the array substrate further comprises: sealant located on the packaging metal layer.

18. The array substrate according to claim 2, wherein, the active area further includes a plurality of pixel units, each pixel unit includes a thin film transistor, and the first electrode is arranged on a same layer as a gate metal layer or a source and drain metal layer of the thin film transistor; the second electrode is arranged on a same layer as the source and drain metal layer or the gate metal layer of the thin film transistor.

19. The array substrate according to claim 3, wherein, the active area further includes a plurality of pixel units, each pixel unit includes a thin film transistor, and the first electrode is arranged on a same layer as a gate metal layer or a source and drain metal layer of the thin film transistor; the second electrode is arranged on a same layer as the source and drain metal layer or the gate metal layer of the thin film transistor.

\* \* \* \* \*